United States Patent
Shi et al.

(10) Patent No.: US 10,969,450 B2
(45) Date of Patent: Apr. 6, 2021

(54) METHOD, DEVICE AND STORAGE MEDIUM FOR SCANNING A K-SPACE TRAJECTORY IN MAGNETIC RESONANCE IMAGING

(71) Applicant: Siemens Healthcare GmbH, Erlangen (DE)

(72) Inventors: Zhong Qiang Shi, Shenzhen (CN); De He Weng, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/392,919

(22) Filed: Apr. 24, 2019

(65) Prior Publication Data
US 2019/0324103 A1 Oct. 24, 2019

(30) Foreign Application Priority Data
Apr. 24, 2018 (CN) .......................... 201810372416.4

(51) Int. Cl.
*G01R 33/48* (2006.01)
*G01R 33/58* (2006.01)
*G01R 33/36* (2006.01)

(52) U.S. Cl.
CPC ..... *G01R 33/4818* (2013.01); *G01R 33/3607* (2013.01); *G01R 33/583* (2013.01)

(58) Field of Classification Search
USPC ........................................................ 324/309
See application file for complete search history.

(56) References Cited

U.S. PATENT DOCUMENTS

| 6,066,949 A * | 5/2000 | Alley ................... G01R 33/385 324/307 |
| 2004/0140802 A1* | 7/2004 | Zhang .............. G01R 33/56554 324/307 |
| 2012/0313641 A1* | 12/2012 | Labadie ............. G01R 33/5616 324/309 |

* cited by examiner

*Primary Examiner* — Rodney E Fuller
(74) *Attorney, Agent, or Firm* — Schiff Hardin LLP

(57) ABSTRACT

In a method, apparatus and storage medium for filling a k-space trajectory in magnetic resonance (MR) imaging, a blank window, following an RF excitation pulse, is set in an arbitrary spatial encoding direction, and a first MR signal is acquired in this blank window, to obtain the phase of the first MR signal. A gradient field is activated outside the blank window and a second MR signal is acquired to obtain the phase of the second MR signal. This first and second MR signals are entered into k-space along first k-space and second k-space trajectories that are respectively based on the phase of the first MR signal and the phase of the second MR signal. A calibrated k-space trajectory in the spatial encoding direction is determined based on the first and second k-space trajectories.

15 Claims, 5 Drawing Sheets

METHOD, DEVICE AND STORAGE MEDIUM FOR SCANNING A K-SPACE TRAJECTORY IN MAGNETIC RESONANCE IMAGING

BACKGROUND OF THE INVENTION

Field of the Invention

The present invention relates to the technical field of magnetic resonance imaging, and in particular to a method and apparatus for scanning (entering acquired data along) k-space trajectory in magnetic resonance imaging.

Description of the Prior Art

In the mathematical domain represented by data points in a memory at which acquired raw data are entered (referred to as filling or scanning k-space). The raw data are spatially encoded by magnetic field gradients produced in the scanner that define the coordinates of the data points in k-space. A magnetic resonance image is produced by performing a Fourier transform on the k-space data, whereby the spatially encoded information in the raw data is decoded so as to obtain magnetic resonance image data.

When the k-space trajectory is filled, due to the non-uniformity and instability of the basic magnetic field in the scanner, namely a background field, there is a certain influence on the resulting of k-space along the intended trajectory, resulting in a deviation of the measurement result. Therefore, how to remove the influence of non-uniformity and instability of the background field on the accuracy of k-space trajectory filling is one of the important problems to be solved in magnetic resonance imaging technology.

SUMMARY OF THE INVENTION

An object of the present invention is to provide a method and apparatus for filling a k-space trajectory in magnetic resonance imaging, which can separate the influence of non-uniformity and instability of the background field, and an eddy-current effect, on the accuracy of the k-space trajectory filling, and thereby improve the measurement accuracy.

According to one aspect of the present invention, a method for filling a k-space trajectory in magnetic resonance imaging has the following steps.

A radio-frequency (RF) excitation pulse and a slice selection gradient pulse are emitted, wherein the slice selection gradient pulse is in the X direction, the Y direction, the Z direction, or a vectorially synthesized direction of at least any two of the X direction, the Y direction and the Z direction.

A blank window is set behind the RF excitation pulse in any spatial encoding direction, with no gradient field being applied (activated) in the blank window.

A first magnetic resonance signal is acquired in the blank window, which is based on said RF excitation pulse in order to obtain the phase of the first magnetic resonance signal.

The scanning or encoding gradient field is applied outside the blank window, and a second magnetic resonance signal is acquired that is based on the RF excitation pulse and the gradient field, in order to obtain the phase of the second magnetic resonance signal.

A first k-space trajectory and a second k-space trajectory are obtained, respectively according to the phase of the first magnetic resonance signal and the phase of the second magnetic resonance signal.

A calibrated k-space trajectory in the spatial encoding direction is determined according to the first k-space trajectory and the second k-space trajectory.

In the embodiments of the present invention, in the spatial encoding direction, by setting a blank window behind the RF excitation pulse to measure a magnetic resonance signal that reflects the background field of a magnetic resonance system, the operation flow of filling the k-space trajectory in the magnetic resonance imaging is simplified, and the accuracy and efficiency of filling the k-space trajectory in magnetic resonance imaging are improved. The technical solution of the present invention can reduce the influence of non-uniformity and instability of the background field and other magnetic fields, as well as an eddy current effect, on the measurement result, and further reduce a measurement error of the k-space trajectory corresponding to the gradient that is used.

The setting of a blank window behind the RF excitation pulse can include applying the RF excitation pulse and slice selection gradient pulse and exciting a magnetic resonance signal on the eccentric slice, and not applying any gradient field in the blank time window according to the preset width of the blank window after excitation.

The acquisition of the first magnetic resonance signal in said blank window, which is based on the RF excitation pulse can include turning on a magnetic resonance signal receiving coil, acquiring the magnetic resonance signal modulated and generated by the background field under the condition that all coded gradient coils are in an off state and using the magnetic resonance signal as said first magnetic resonance signal.

Optionally, not applying any gradient field in the blank time window according to the preset width of the blank window after excitation includes controlling the time when the encoded gradient coil is in an off state, according to the preset width of the blank window.

Optionally, the width of said blank window is set according to the accuracy requirement and/or speed requirement of the k-space trajectory measurement.

Optionally, the acquisition of the second magnetic resonance signal outside said blank window includes, after the measured gradient field is applied, turning on the magnetic resonance signal receiving coil and using the received magnetic resonance signal as said second magnetic resonance signal.

Optionally, the determination of the calibrated k-space trajectory in the spatial encoding direction according to said first k-space trajectory and said second k-space trajectory includes determining said calibrated k-space trajectory in the spatial encoding direction according to the following relationship between the k-space trajectory and the phase difference:

$$\Delta\varnothing_{1r}(t)=K_{1r}(t);$$

$$\Delta\varnothing_{2r}(t)=D_r K_{2r}(t);$$

$$K_{2r}^{cal}(t)=K_{2r}(t)-K_{1r}^{extend}(t);$$

wherein r is the spatial encoding direction; $\Delta\varnothing_{1r}(t)$ is the phase of the first magnetic resonance signal; $\Delta\varnothing_{2r}(t)$ is a cumulative phase of the second magnetic resonance signal; $D_r$ is the distance from the slice to the gradient isocenter in the spatial encoding direction r; $K_{1r}(t)$ is a k-space trajectory that results from the background field calculated from the first magnetic resonance signal; $K_{2r}(t)$ is a k-space trajectory calculated from the second magnetic resonance signal; and $K_{1r}^{extend}(t)$ is a k-space trajectory that results from the background field calculated from the first magnetic resonance signal in said blank window.

According to a further aspect of the present invention, an apparatus for filling a k-space trajectory in magnetic resonance imaging has the following components that operate an MR scanner of the apparatus.

A setting controller applies a radio-frequency (RF) excitation pulse and a slice selection gradient pulse, wherein the slice selection gradient pulse is in an X direction, a Y direction, a Z direction or a synthesized direction of at least any two of the X direction, the Y direction and the Z direction, and sets a blank window behind the RF excitation pulse in any spatial encoding direction, with no gradient field being applied in this blank window.

A first acquisition module acquires a first magnetic resonance signal in said blank window to obtain the phase of said first magnetic resonance signal.

A second acquisition module activates the measured gradient field outside the blank window and acquires a second magnetic resonance signal to obtain the phase of the second magnetic resonance signal.

A processor fills a first k-space trajectory and a second k-space trajectory according to the phase of the first magnetic resonance signal and the phase of the second magnetic resonance signal respectively, and determines the calibrated k-space trajectory in the spatial encoding direction according to the first k-space trajectory and the second k-space trajectory.

Optionally, the setting controller includes a first controller that applies the RF excitation pulse and slice selection gradient pulse and excite a magnetic resonance signal on the eccentric slice, a second controller that does not apply any gradient field in the blank window according to the preset width of the blank window after excitation, a third controller that turns on the encoded gradient coil in said spatial encoding direction and apply the measured gradient field.

Optionally, the third controller includes a setting subunit.

The setting subunit is used to control the time when the encoded gradient coil is in the off state, according to the preset width of the blank window, or set the width of said blank window according to the accuracy requirement and/or speed requirement of the k-space trajectory measurement.

Optionally, the first acquisition module includes a first processor that turns on a magnetic resonance signal-receiving coil, acquire the magnetic resonance signal modulated and generated by the background field under the condition that all coded gradient coils are in an off state and use the magnetic resonance signal as said first magnetic resonance signal.

Optionally, the second acquisition module includes a fourth controller and a second processor.

Optionally, the fourth controller turns on the magnetic resonance signal-receiving coil after the measured gradient field is applied, and the second processor acquires the magnetic resonance signal modulated and generated by combined action of the measured gradient field and the background field and use the magnetic resonance signal as said second magnetic resonance signal.

Optionally, the originally-noted processor determines the calibrated k-space trajectory in the spatial encoding direction according to the first k-space trajectory and the second k-space trajectory includes determining the calibrated k-space trajectory in the spatial encoding direction according to the following relationship between the k-space trajectory and the phase difference:

$$\Delta\varnothing_{1_r}(t)=K_{1_r}(t);$$

$$\Delta\varnothing_{2_r}(t)=D_rK_{2_r}(t);$$

$$K_{2_r}^{cal}(t)=K_{2_r}(t)-K_{1_r}^{extend}(t);$$

wherein r is the spatial encoding direction; $\Delta\varnothing_{1_r}(t)$ is the phase of the first magnetic resonance signal; $\Delta\varnothing_{2_r}(t)$ is a cumulative phase of the second magnetic resonance signal; $D_r$ is the distance from the slice to the gradient isocenter in the spatial encoding direction r; $K_{1_r}(t)$ is a k-space trajectory that results from the background field calculated from the first magnetic resonance signal; $K_{2_r}(t)$ is a k-space trajectory calculated from the second magnetic resonance signal; and $K_{1_r}^{extend}(t)$ is a k-space trajectory that is calculated by linear fitting of the first magnetic resonance signal in the blank window.

The present invention also encompasses a non-transitory, computer-readable data storage medium encoded with programming instructions that, when loaded into a computer or computer system of an magnetic resonance apparatus, cause the computer or computer system to operate the magnetic resonance apparatus in order to implement any or all embodiments of the method according to the invention, as described above.

As can be seen from the above solution, according to the present invention, by setting a blank window in each spatial encoding direction and acquiring a first magnetic resonance signal in the blank window, the first magnetic resonance signal can reflect the influence of the background field and the eddy current effect on a measured object. Then, in the embodiment of the present application, the phase of a second magnetic resonance signal obtained by the normal measurement process is further calibrated by using the phase of the first magnetic resonance signal, so that the influence of the background field and the eddy current effect on k-space trajectory measurement results can be separated, and the deviation is removed, thereby improving the accuracy of the k-space trajectory measurement.

DESCRIPTION OF THE PREFERRED EMBODIMENTS

In order to make the objectives, technical solutions and advantages of the present invention clearer, the technical solutions in the embodiments of the present invention are clearly and completely described below with reference to the accompanying drawings in the embodiments of the present invention. Obviously, the described embodiments are some embodiments of the present invention rather than all embodiments. All other embodiments obtained by those of ordinary skill in the art based on the embodiments of the present invention without creative efforts are in the protective scope of the present invention.

The terms "include" and "have" and any form thereof in the specification and claims of the present invention are intended to cover non-exclusive inclusions. For example, a process, method, system, product, or device that includes a series of steps or units is not necessarily limited to those steps or units that are explicitly listed, and may include other steps or units not explicitly listed or inherent to such processes, methods, products or devices.

Figure 1:
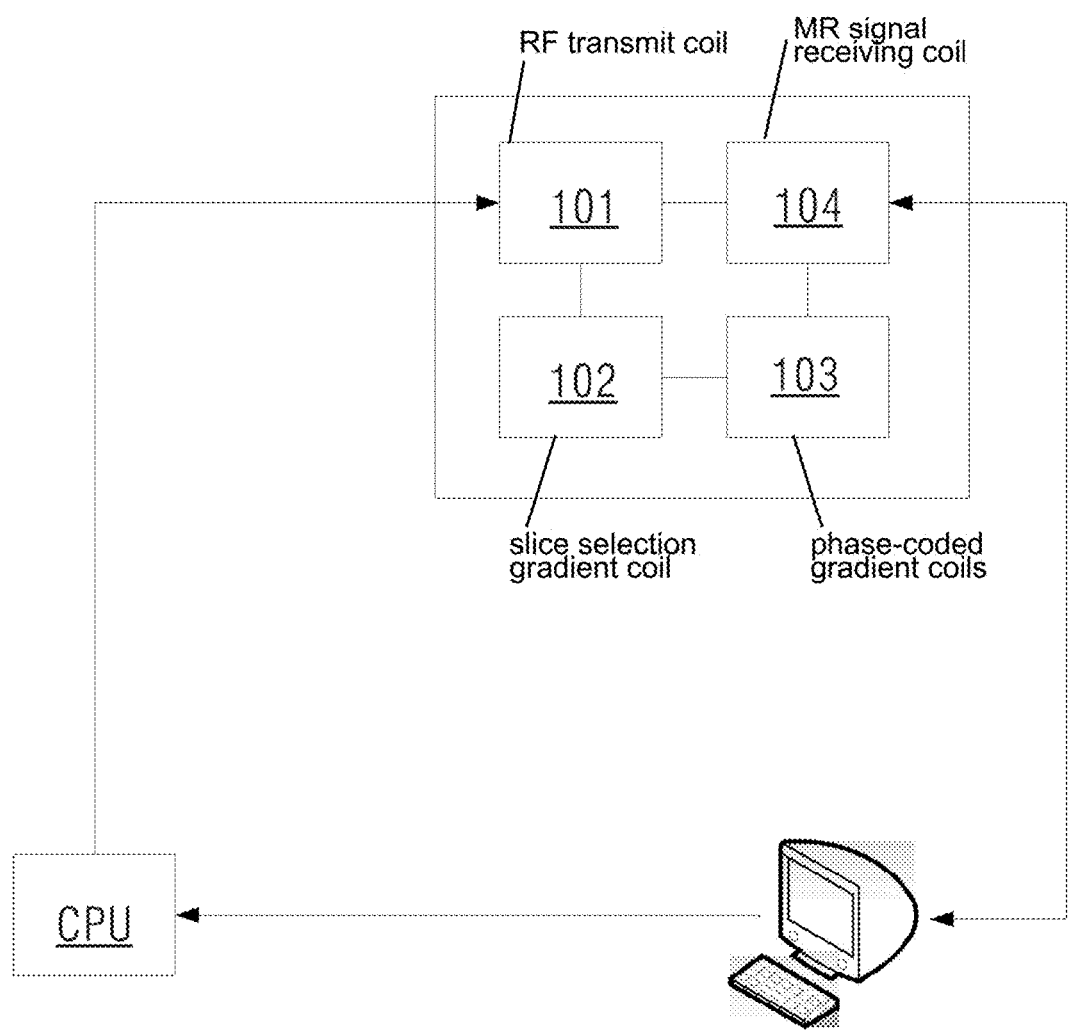
FIG. 1 is a schematic illustration of a magnetic resonance imaging process.

It can be understood by those skilled in the art that, in the magnetic resonance imaging process shown in the example of FIG. 1, after the measured object is placed in a magnet, in order to measure the intensity and phase of an induced magnetic field of a measured tissue portion of the measured object under the action of the magnetic field, first, a magnetic resonance imaging control device sequentially activates, in accordance with a set magnetic resonance (MR) imaging sequence, a radio-frequency transmit coil 101, a slice selection gradient coil 102 and phase-coded gradient coils 103 in each spatial encoding direction to apply different magnetic fields on the measured object; then, a magnetic resonance signal receiving coil 104 is turned on to acquire a magnetic resonance signal that reflects the intensity and phase of the induced magnetic field of the measured tissue portion in the measured object; finally the acquired magnetic resonance signal is processed to obtain a k-space trajectory of the magnetic resonance signal corresponding to each spatial coding direction, and eventually imaging is conducted.

However, as mentioned above, the non-uniformity of the main magnetic field and other magnetic fields and the eddy current effect may affect the measurement results, so that there is a deviation between the measured k-space trajectory and the real k-space trajectory. Consequently, it is necessary to calibrate the measured k-space trajectory.

Embodiments of the present invention provide a method, an apparatus and a non-transitory computer-readable storage medium for filling a k-space trajectory in magnetic resonance imaging, which can remove the non-uniformity of the background field and the eddy current effect to cope with the deviation resulting from the k-space trajectory, and improve the accuracy of the k-space trajectory measurement.

Figure 2:
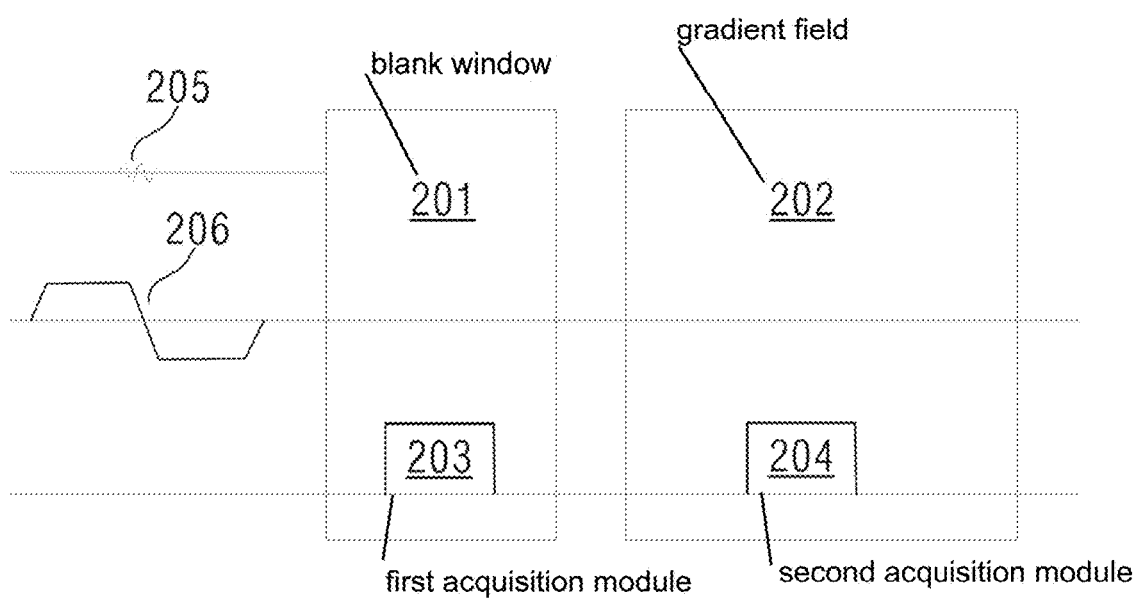
FIG. 2 is a schematic illustration of a magnetic resonance imaging process according to an embodiment of the present invention.

As shown in FIG. 2, FIG. 2 is a schematic illustration of a magnetic resonance imaging process according to an embodiment of the present invention. In the magnetic resonance imaging process, a blank window 201 and a gradient field 202 to be activated are provided. A radio-frequency (RF) excitation pulse 205 and a slice selection gradient pulse 206 are applied to excite a magnetic resonance signal; the slice selection gradient pulse 206 is turned off, a first magnetic resonance signal which is based on said RF excitation pulse 205 in the blank window 201 is acquired by using a first acquisition module 203, to obtain the phase of the first magnetic resonance signal; and a second magnetic resonance signal which is based on the RF excitation pulse 205 and the slice selection gradient pulse 206 is acquired by using a second acquisition module 204, to obtain the phase of the second magnetic resonance signal. Finally, a calibrated k-space trajectory in the spatial encoding direction is determined by processing the phase of the first magnetic resonance signal and the phase of the second magnetic resonance signal.

Figure 3:
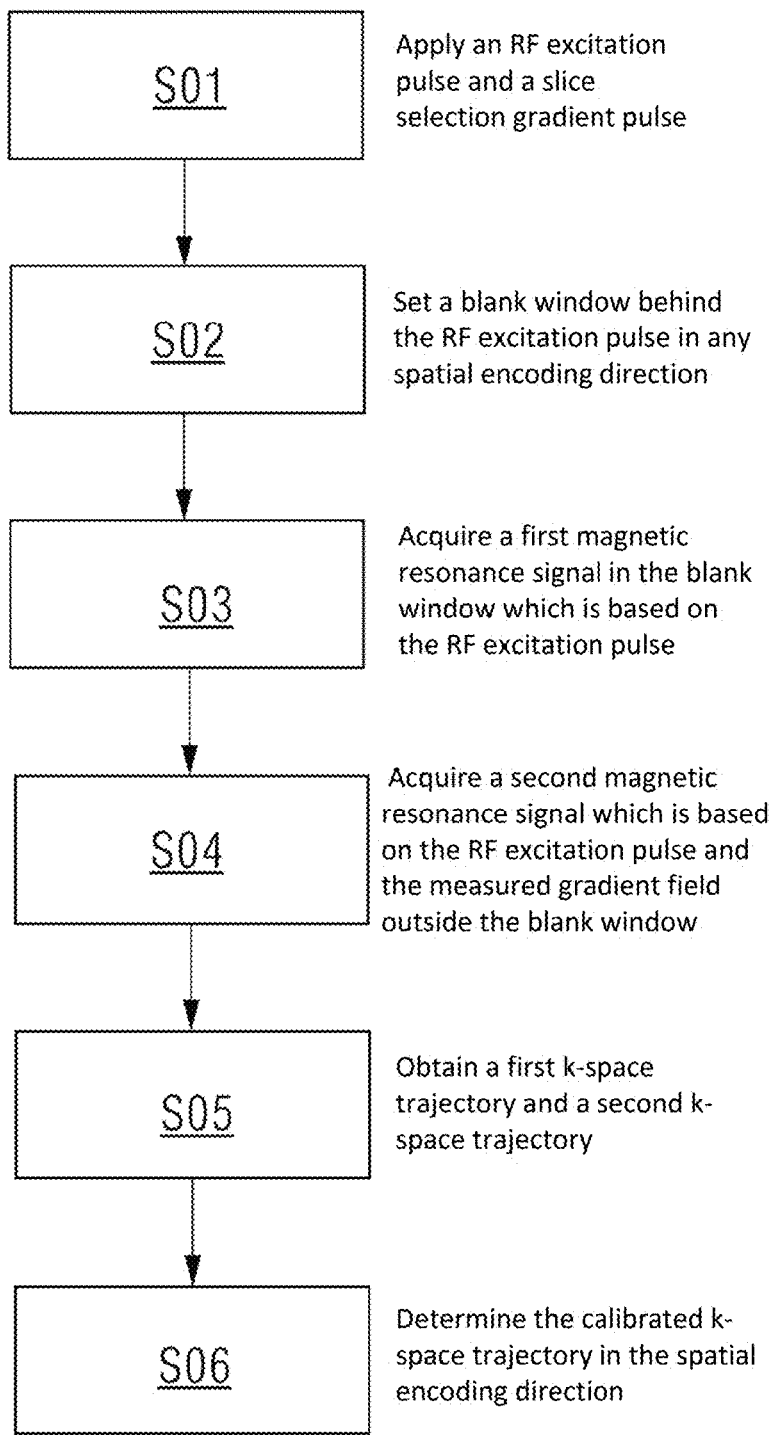
FIG. 3 is a flowchart of a method for filling a k-space trajectory in magnetic resonance imaging according to an embodiment of the present invention.

In an embodiment of the present invention, referring to FIG. 3, the figure shows a method for filling a k-space trajectory in magnetic resonance imaging in an embodiment of the present invention, and the specific steps are as follows:

S01: Apply a radio-frequency (RF) excitation pulse and a slice selection gradient pulse; where the slice selection gradient pulse is in an X direction, a Y direction, a Z direction or a synthesized direction of at least any two of the X direction, the Y direction and the Z direction.

In the embodiment of the present application, the direction of the magnetic field applied by a phase-encoding coil can be represented by the directions of the three coordinate axes X, Y, and Z in a space rectangular coordinate system.

S02: Set a blank window behind the RF excitation pulse in any spatial encoding direction, where no gradient field is applied in said blank window.

In the embodiment of the present application, said blank window may be a time window, and specifically may refer to a time window during which a gradient field is applied to an MRI device. The width of said blank window represents the duration of this time window. In the embodiment of the present application, it can be considered that no gradient field is applied in the blank window, and the measured gradient field is applied outside said blank window.

In an embodiment of the present application, a blank window may be first set after the RF excitation pulse, and then the measured gradient field may be applied. Specifically, in this case, the operation of setting a blank window may specifically include: first, applying the RF excitation pulse and slice selection gradient pulse and exciting a magnetic resonance signal on the eccentric slice; then, not applying any gradient field for a certain period of time according to the preset width of the blank window after excitation; during which the coded gradient coil in each spatial encoding direction is kept in an off state; at this time, the blank window has been set and a magnetic resonance signal can be acquired during this period; and finally, turning on the encoded gradient coil in said spatial encoding direction, applying the measured gradient field, after which the magnetic resonance signal can be acquired again.

It will be understood by those skilled in the art that since all the encoding coils are in the off state and no gradient field is applied in said blank window, the magnetic resonance signal acquired in said blank window reflects the result of the background field acting on the measured object.

In the embodiment of the present application, it is further required to preset the width of the blank window, and the time when the encoded gradient coil is in the off state is controlled, according to the preset width of the blank window. The above-mentioned width of the blank window may be preset according to the factors of the accuracy requirement and/or speed requirement of the k-space trajectory measurement, for example, may be set to 1-10 ms, such as 2 ms, 3 ms, or 5 ms. If the accuracy requirement is mainly considered, the width of the blank window should be set relatively large, so that the result of the background field acting on the measured object can be accurately measured; and if the speed requirement is mainly considered, the width of the blank window should be set relatively small, so that the k-space trajectory measurement process can be shortened.

S03: Acquire a first magnetic resonance signal in said blank window which is based on the RF excitation pulse to obtain the phase of the first magnetic resonance signal $\Delta\varnothing_{1,r}(t)$, where r represents the spatial encoding direction; and t represents time.

As previously mentioned, in the blank window, all of the encoding coils are in an off state, so the first magnetic resonance signal acquired is the signal produced by the action of the background field.

Specifically, in the embodiment of the present application, the process of acquiring the first magnetic resonance signal may include: turning on a magnetic resonance signal receiving coil, acquiring the magnetic resonance signal modulated and generated by the background field in all the spatial encoding directions under the condition that all coded gradient coils are in the off state and using the magnetic resonance signal as the first magnetic resonance signal.

After the first magnetic resonance signal is obtained, the phase of the first magnetic resonance signal $\Delta\emptyset_{1r}(t)$ can be directly extracted.

S04: Acquire a second magnetic resonance signal which is based on said RF excitation pulse and said measured gradient field outside said blank window to obtain the phase of said second magnetic resonance signal $\Delta\emptyset_{2r}(t)$, where r represents the spatial encoding direction; and t represents time.

As previously mentioned, outside the blank window, the measured gradient field is applied, that is, the coded gradient coil in the above-mentioned spatial encoding direction is in an on state. This is because the acquired second magnetic resonance signal is a signal generated by combined action of the background field and the measured gradient field.

Specifically, in the embodiment of the present application, the process of acquiring the second magnetic resonance signal may include: after the measured gradient field is applied, turning on the magnetic resonance signal receiving coil; acquiring the magnetic resonance signal modulated and generated by combined action of the measured gradient field and background field and using the magnetic resonance signal as said second magnetic resonance signal.

S05: Obtain a first k-space trajectory $K_{1r}(t)$ and a second k-space trajectory $K_{2r}(t)$ according to the phase of said first magnetic resonance signal $\Delta\emptyset_{1r}(t)$ and the phase of said second magnetic resonance signal $\Delta\emptyset_{2r}(t)$ respectively.

Specifically, in the embodiment of the present application, the calculation formulae of the phase of said first magnetic resonance signal $\Delta\emptyset_{1r}(t)$ and the phase of said second magnetic resonance signal $\Delta\emptyset_{2r}(t)$ respectively and the first k-space trajectory $K_{1r}(t)$ and the second k-space trajectory $K_{2r}(t)$ include:

$$\Delta\emptyset_{1r}(t)=K_{1r}(t);$$

$$\Delta\emptyset_{2r}(t)=D_r K_{2r}(t);$$

wherein r is the spatial encoding direction; and $D_r$ is the distance from the slice to the gradient isocenter in the spatial encoding direction r.

S06: Determine the calibrated k-space trajectory $K_{2r}^{cal}(t)$ in the spatial encoding direction r according to the first k-space trajectory $K_{1r}(t)$ and the second k-space trajectory $K_{2r}(t)$.

Specifically, in the embodiment of the present application, the k-space trajectory in the spatial encoding direction may be determined by the following calculation technique:

$$K_{2r}^{cal}(t)=K_{2r}(t)-K_{1r}^{extend}(t)$$

wherein $K_{1r}^{extend}(t)$ is a k-space trajectory that is calculated from the first magnetic resonance signal $K_{1r}(t)$ to reflect a zero order background field; $K_{2r}(t)$ is a k-space trajectory calculated from the second magnetic resonance signal; and $K_{2r}(t)$ takes the phase of a first point of the received magnetic resonance signal as a zero-phase reference.

At the same time, it is supposed that the background field is constant during the test, so $\Delta\emptyset_{1r}(t)$ and $K_{1r}(t)$ should linearly vary with time:

$$\Delta\emptyset_{1r}(t)=\int_0^t \gamma \Delta B dt;$$

in the formula, $\Delta B$ is fixed, and $\Delta\emptyset_{1r}(t)$ linearly varies with time. Therefore, a linear fit value of $K_{1r}(t)$ obtained in the blank window can be used as the k-space trajectory change that results from the background field in the blank window, and is marked as: $K_{1r}^{extend}(t)$.

In the embodiment of the present invention, when the ramp-up rate of the slice selection gradient is small, an eddy current generated by the slice gradient can be neglected and has little influence on the gradient field to be measured, and the measurement error can also be neglected. Therefore, the influence of the high-order phase in the first magnetic resonance signal of the background field gradient signal is simplified, and the linear phase of the background field gradient signal is generated, which can improve the efficiency in the process of measuring the phase difference between the first magnetic resonance signal and the second magnetic resonance signal in the k-space trajectory in magnetic resonance imaging.

As can be seen from the above-described technical solution, according to the embodiment of the present invention, by setting a blank window in each spatial encoding direction and acquiring a first magnetic resonance signal in the blank window, the first magnetic resonance signal can reflect the influence of the background field and the eddy current effect on a measured object. In the embodiment of the present invention, the phase of a second magnetic resonance signal acquired outside the blank window by the normal measurement process is further calibrated by using the phase of the first magnetic resonance signal, so that the influence of the background field and the eddy current effect on k-space trajectory measurement results can be separated, and the deviation is removed, thereby improving the accuracy of the k-space trajectory measurement.

Figure 4:
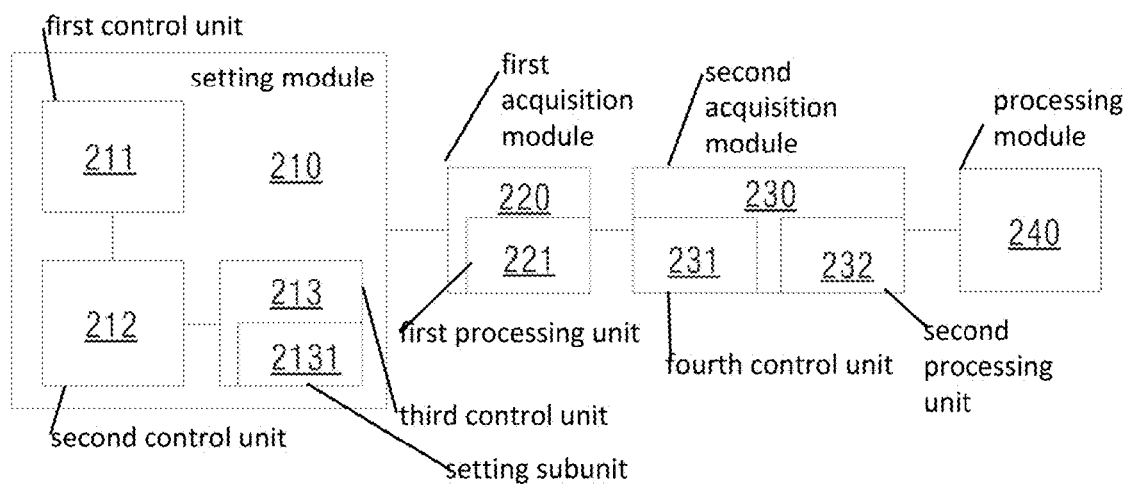
FIG. 4 is a schematic illustration of an apparatus for filling a k-space trajectory in magnetic resonance imaging according to an embodiment of the present invention.

In an embodiment of the present invention, referring to FIG. 4, the figure shows a device 200 for measuring a k-space trajectory in magnetic resonance imaging in an embodiment of the present invention, and the device specifically includes: a setting module 210, a first acquisition module 220, a second acquisition module 230, and a processing module 240.

The setting module 210 is used to apply a radio-frequency (RF) excitation pulse and a slice selection gradient pulse, where the slice selection gradient pulse is in an X direction, a Y direction, a Z direction or a synthesized direction of at least any two of the X direction, the Y direction and the Z direction; and to set a blank window behind the RF excitation pulse in any spatial encoding direction, with no measured gradient field being applied in the blank window.

In the embodiment of the present application, said blank window may be a time window, and specifically may refer to a time window within which an MRI device does not load a phase-coded gradient field, and the width of the blank window represents the duration of this time window.

In an embodiment of the present application, the setting module 210 includes a first control unit 211, a second control unit 212, and a third control unit 213.

The first control unit 211 is used to apply the RF excitation pulse and slice selection gradient pulse and excite a magnetic resonance signal on the eccentric slice.

The second control unit 212 is used to not apply any measured gradient field in the blank window according to the preset width of the blank window after excitation.

The third control unit 213 is used to turn on the encoded gradient coil in the spatial encoding direction and apply the measured gradient field.

It will be understood by those skilled in the art that, in the blank window, the setting module controls all of the encoding coils to be in an off state. Therefore, the magnetic resonance signal acquired in the blank window reflects the result of the background field and the eddy current effect acting on the measured object.

In an embodiment of the present application, the third control unit 213 includes a setting subunit 2131.

The setting subunit 2131 is used to control the time when the encoded gradient coil is in the off state, according to the preset width of the blank window, and set the width of said blank window according to the accuracy requirement and/or speed requirement of the k-space trajectory filling.

The first acquisition module 220 is used to acquire a first magnetic resonance signal in the blank window which is based on said RF excitation pulse to obtain the phase of the first magnetic resonance signal.

In an embodiment of the present application, the first acquisition module 220 includes a first processing unit 221.

The first processing unit 221 is used to turn on a magnetic resonance signal receiving coil, acquire the magnetic resonance signal modulated and generated by the background field under the condition that the all coded gradient coils are in an off state in each spatial encoding direction and use the magnetic resonance signal as the first magnetic resonance signal.

After the first processing unit 221 obtains the first magnetic resonance signal, the first magnetic resonance signal is further processed to obtain the phase of the first magnetic resonance signal $\varphi_{1r}(t)$.

The second acquisition module 230 is used to apply the measured gradient field outside said blank window and acquire a second magnetic resonance signal which is based on said RF excitation pulse and the measured gradient field to obtain the phase of the second magnetic resonance signal.

In an embodiment of the present application, the second acquisition module 230 includes a fourth control unit 231 and a second processing unit 232.

The fourth control unit 231 is used to turn on the magnetic resonance signal receiving coil after the measured gradient field is applied, and the second processing unit 232 is used to acquire the magnetic resonance signal modulated and generated by combined action of the measured gradient field and the background field and use the magnetic resonance signal as the second magnetic resonance signal.

In the embodiment of the present application, outside the blank window, the fourth control unit 231 turns on the coded gradient coil in the current spatial encoding direction, and the second magnetic resonance signal acquired by the second processing unit 232 is a signal generated by the combined action of the background field and the coded gradient field in the spatial encoding direction.

The processing module 240 is used to obtain a first k-space trajectory and a second k-space trajectory according to the phase of said first magnetic resonance signal and the phase of said second magnetic resonance signal respectively; and determine the calibrated k-space trajectory in the spatial encoding direction according to the first k-space trajectory and the second k-space trajectory.

In the embodiment of the present application, the processing module 240 determines the calibrated k-space trajectory in the spatial encoding direction according to said first k-space trajectory and said second k-space trajectory, including determining said calibrated k-space trajectory in the spatial encoding direction according to the following relationship between the k-space trajectory and the phase difference:

$$K_{2r}^{cal}(t) = K_{2r}(t) - K_{1r}^{extend}(t);$$

wherein r is the spatial encoding direction; $K_{2r}(t)$ is the k-space trajectory calculated from the second magnetic resonance signal; $K_{1r}^{extend}(t)$ is the k-space trajectory that is calculated from the first magnetic resonance signal in said blank window to reflect the influence of the background field; and $K_{2r}^{cal}(t)$ is the calibrated k-space trajectory in the spatial encoding direction r.

Figure 5:
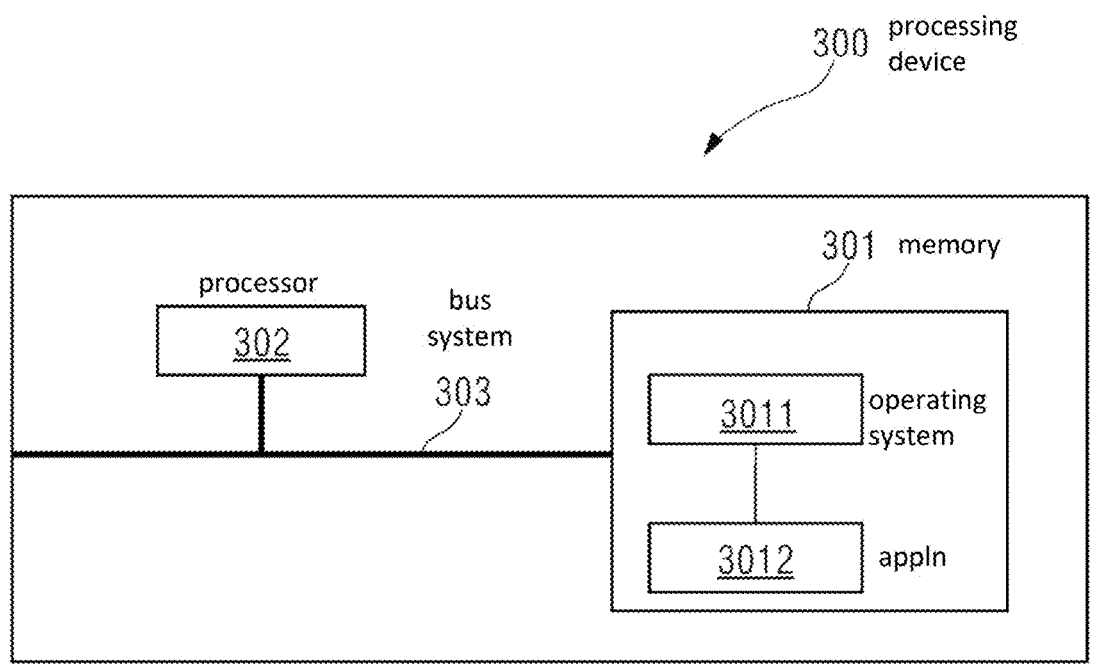
FIG. 5 is a schematic structural illustration of a device for filling a k-space trajectory in magnetic resonance imaging according to another embodiment of the present invention.

FIG. 5 is a schematic structural view of log processing according to another embodiment of the present invention. As shown in FIG. 5, a processing device 300 for log processing shown in FIG. 5 includes at least one memory 301 and a processor 302. The at least one processor 301 is used to store a computer program; said at least one processor 302 is used to call the computer program stored in said at least one memory to perform the method for measuring the k-space trajectory in magnetic resonance imaging as described in any one of the above aspects. Various components in a terminal 300 are coupled together via a bus system 303. It will be understood that the bus system 303 is used to implement connection and communication between these components. The bus system 303 includes a power bus, a control bus, and a status signal bus in addition to a data bus. However, for clarity of description, various buses are labeled as the bus system 303 in FIG. 3.

It will be understood that the memory 301 in the embodiments of the present invention may be a volatile memory or a non-volatile memory, or may include both a volatile memory and a non-volatile memory. The non-volatile memory may be a read-only memory (ROM), a programmable read-only memory (PROM), an erasable programmable read-only memory (EPROM), an electrically erasable programmable read-only memory (EEPROM) or a flash memory. The volatile memory may be a random access memory (RAM) that acts as an external cache. By way of exemplary but not restrictive description, many forms of RAMs are available, such as a static random access memory (SRAM), a dynamic random access memory (DRAM), a synchronous dynamic random access memory (SDRAM), a double data rate synchronous dynamic random access memory (DDRSDRAM), an enhanced synchronous dynamic random access memory (ESDRAM), a synchlink dynamic random access memory (SLDRAM) and a direct rambus random access memory (DRRAM). The memory 301 for the system and method described in the embodiments of the present invention is intended to include, but is not limited to, these and any other suitable types of memories.

In some embodiments, the memory 301 stores the following elements, executable modules or data structures, or a subset thereof, or an extended set thereof: an operating system 3011 and an application 3012.

The operating system 3011 includes various system programs, such as a framework layer, a core library layer, a driver layer, and the like, for implementing various basic services and processing hardware-based tasks. The application 3012 includes various applications, such as a media player, a browser, and the like, for implementing various application services. A program for implementing the method according to the embodiment of the present invention may be included in the application 3012.

In the embodiment of the present invention, by calling a program or an instruction stored in the memory 301, which specifically may be a program or an instruction stored in the application 3012, the processor 302 may execute the method executed by the above log processing device.

The method disclosed in the foregoing embodiment of the present invention may be applied to the processor 302 or implemented by the processor 302. The processor 302 may be an integrated circuit chip having signal processing capabilities. In the implementation process, each step of the above method may be completed by an integrated logic circuit of hardware in the processor 302 or an instruction in the form of software. The processor 301 described above may be a general-purpose processor, a digital signal processor (DSP), an application specific integrated circuit (ASIC), a field-programmable gate array (FPGA) or other programmable logic devices, discrete gates or transistor logic devices, or discrete hardware components. The methods, steps, and logic block diagrams disclosed in the embodiments of the present invention may be implemented or carried out. The general-purpose processor may be a microprocessor or the processor or any conventional processor or the like. The steps of the method disclosed in the embodiment of the present invention may be directly implemented by a hardware-decoding processor, or may be performed by a combination of hardware and software modules in the decoding processor. The software modules can be located in mature storage mediums in the field such as a random access memory, a flash memory, a read-only memory, a programmable read-only memory or an electrically erasable programmable memory, a register, and the like. The storage medium is located in the memory 302, and the processor 301 reads information in the memory 302 and completes the steps of the above method in combination with hardware thereof.

It will be understood that these embodiments described in embodiments of the present invention may be implemented in hardware, software, firmware, middleware, microcode, or a combination thereof. For hardware implementations, the processing unit can be implemented in one or more application specific integrated circuits (ASICs), a digital signal processor (DSP), a DSP device (DSPD), a programmable logic device (PLD), a field-programmable gate array (FPGA), a general-purpose processor, a controller, a microcontroller, a microprocessor, other electronic units for performing the described functions of the present invention, or a combination thereof.

For the software implementation, the technology described in the embodiment of the present invention may be implemented by a module (such as a process and a function) that performs the functions described in the embodiment of the present invention. Software code can be stored in the memory and executed by the processor. The memory can be implemented in the processor or external to the processor.

In this embodiment, the processor 302 is specifically used for:

applying a radio-frequency (RF) excitation pulse and a slice selection gradient pulse, wherein the slice selection gradient pulse is in an X direction, a Y direction, a Z direction or a synthesized direction of at least any two of the X direction, the Y direction and the Z direction;

setting a blank window behind the RF excitation pulse in any spatial encoding direction, wherein no gradient field is applied in the blank window;

acquiring a first magnetic resonance signal in the blank window which is based on the RF excitation pulse to obtain the phase of the first magnetic resonance signal;

applying the measured gradient field outside the blank window and acquiring a second magnetic resonance signal which is based on the RF excitation pulse and said measured gradient field to obtain the phase of the second magnetic resonance signal;

obtaining a first k-space trajectory and a second k-space trajectory according to the phase of the first magnetic resonance signal and the phase of the second magnetic resonance signal respectively; and determining the calibrated k-space trajectory in the spatial encoding direction according to the first k-space trajectory and said second k-space trajectory.

Optionally, the processor 302 is further used for applying the RF excitation pulse and slice selection gradient pulse and exciting a magnetic resonance signal on the eccentric slice; and not applying any gradient field in the blank window according to the preset width of the blank window after excitation.

Optionally, the processor 302 is further used for:

turning on a magnetic resonance signal receiving coil, acquiring the magnetic resonance signal modulated and generated by the background field under the condition that all encoding gradient coils are in an off state and using the magnetic resonance signal as the first magnetic resonance signal.

Optionally, the processor 302 is further used for:

controlling the time when the encoding gradient coil is in an off state, according to the preset width of the blank window.

Optionally, the processor 302 is further used for:

setting the width of said blank window according to the accuracy requirement and/or speed requirement of the k-space trajectory measurement.

Optionally, the processor 302 is further used for:

after the measured gradient field is applied, turning on the magnetic resonance signal receiving coil and using a received magnetic resonance signal as the second magnetic resonance signal.

Optionally, the processor 302 is further used for:

determining the calibrated k-space trajectory in the spatial encoding direction according to the first k-space trajectory and the second k-space trajectory, which includes determining the calibrated k-space trajectory in the spatial encoding direction according to the following relationship between the k-space trajectory and the phase difference:

$$\Delta\varnothing_{1r}(t)=K_{1r}(t);$$

$$\Delta\varnothing_{2r}(t)=D_rK_{2r}(t);$$

$$K_{2r}^{cal}(t)=K_{2r}(t)-K_{1r}^{extend}(t);$$

wherein r is the spatial encoding direction; $\Delta\varnothing_{1r}(t)$ is the phase of the first magnetic resonance signal; $\Delta\varnothing_{2r}(t)$ is a cumulative phase of the second magnetic resonance signal; $D_r$ is the distance from the slice to the gradient isocenter in the spatial encoding direction r; $K_{1r}(t)$ is a k-space trajectory that results from the background field calculated from the first magnetic resonance signal; $K_{2r}(t)$ is a k-space trajectory calculated from the second magnetic resonance signal; and $K_{1r}^{extend}(t)$ is a k-space trajectory that results from the background field calculated by linear fitting of the first magnetic resonance signal in the blank window; and $K_{2r}^{cal}(t)$ is the calibrated k-space trajectory in the spatial encoding direction r.

Those of ordinary skill in the art may be aware that the units and algorithm steps of the various examples described in combination with the embodiments disclosed in the present invention can be implemented in electronic hardware or a combination of computer software and electronic hardware. Whether these functions are performed in hardware or software depends on the specific application and design constraints of the technical solution. A person skilled in the art can use different methods to implement the described functions for each particular application, but such implementation should not be considered to be beyond the scope of the present invention.

An embodiment of the present invention further provides a non-transitory computer-readable storage medium, where the computer-readable storage medium stores a computer program, and the computer program is executed by the processor to implement various processes of the method of the log processing method, and can achieve the same technical effect, which will not be described here in order to avoid repetition. The computer-readable storage medium is such as a read-only memory (ROM), a random access memory (RAM), a magnetic disk, or an optical disc.

Those skilled in the art will understand that, for the convenience and brevity of description, references can be made to the corresponding process in the foregoing method embodiment for the specific working process of the system, the device and the unit described above, and details are not described herein again.

In the embodiments provided by the present invention, it should be understood that the disclosed device/method may be implemented in other manners. For example, the device embodiments described above are merely illustrative. For example, the division of the units is only a logical function division, and in actual implementation, there may be another division manners. For example, multiple units or components may be combined or integrated into another system, or some features may be omitted or not implemented. In addition, the mutual coupling or direct coupling or communication connection shown or discussed may be an indirect coupling or communication connection through some interfaces, devices or units, and may be electrical, mechanical or otherwise.

The units described as separate components may or may not be physically separated, and the components displayed as units may or may not be physical units, that is, the units and the components may be located in one place, or may be distributed to multiple network units. Some or all of the units may be selected according to actual needs to achieve the objective of the solution of the embodiment.

In addition, each functional unit in each embodiment of the present invention may be integrated into one processing unit, or each unit may exist physically separately, or two or more units may be integrated into one unit.

The functions, if implemented in the form of a software functional unit and sold or used as an independent product, may be stored in a computer-readable storage medium. Based on such understanding, the technical solution of the present invention, in essence or the contribution to the prior art, or part of the technical solution may be embodied in the form of a software product. The computer software product is stored in a storage medium, and includes a number of instructions used to cause a computer device (which may be a personal computer, a server, or a network device, etc.) to perform all or part of the steps of the method described in various embodiments of the present invention. The foregoing storage medium includes: a variety of media that can store program code, such as a USB flash disk, a mobile hard disk, an ROM, an RAM, a magnetic disk, or an optical disc.

It should be understood that, although the specification has been described in terms of various embodiments, it is not intended that each embodiment includes only one independent technical solution. This description is for clarity only. Those skilled in the art should take the specification as a whole, and the technical solutions in the respective embodiments may also be combined as appropriate to form other embodiments that can be understood by those skilled in the art.

The series of detailed descriptions set forth above are merely specific illustrations of feasible embodiments of the present invention, and are not intended to limit the protection scope of the present invention. Equivalent embodiments or variations not departing from the technical spirit of the present invention, such as combinations, divisions, or repetitions of the features, should fall within the protection scope of the present invention.

The invention claimed is:

1. A method for operating a magnetic resonance (MR) apparatus comprising an MR data acquisition scanner, said method comprising:

operating said MR data acquisition scanner to apply a radio-frequency (RF) excitation pulse and slice selection gradient pulse in said MR data acquisition scanner;

operating said MR data acquisition scanner to set a blank window following said RF excitation pulse in any spatial encoding direction, with no gradient field being applied during said blank window;

operating said MR data acquisition scanner to acquire a first MR signal during said blank window, resulting from said RF excitation pulse, in order to obtain a phase of said first MR resonance signal;

operating said MR data acquisition scanner to apply a gradient field at a time outside said blank window, and to acquire a second MR signal during said blank window, resulting from said RF excitation and said gradient field, in order to obtain a phase of said second MR signal;

providing said first and second MR signals to a processor and, via said processor, entering said first and second MR signals into a memory organized as k-space along a first k-space trajectory and a second k-space trajectory respectively based on said phase of said first MR signal and said phase of said second MR signal; and in said processor, determining a calibrated k-space trajectory in a spatial encoding direction based on said first k-space trajectory and said second k-space trajectory.

2. A method as claimed in claim 1 comprising setting said blank window by applying said RF excitation pulse and said slice selection gradient and exciting a magnetic resonance signal in eccentric slices, while not applying any gradient field within said blank window, based on a preset width of said blank window after said excitation.

3. A method as claimed in claim 2 comprising controlling said time when no gradient field is activated dependent on said preset width of said blank window.

4. A method as claimed in claim 3 comprising setting said width of said blank window according to at least one of an accuracy requirement or a speed requirement for filling said first and second k-space trajectories.

5. A method as claimed in claim 1 comprising acquiring said first MR signal by activating an MR signal receiving coil of said MR data acquisition scanner, and acquiring said first MR signal produced by a basic magnetic field modulation under all gradients.

6. A method as claimed in claim 1 comprising acquiring said second MR signal outside said blank window by, after activating an encoding gradient field, activating an MR signal receiving coil of said MR data acquisition scanner, and receiving said second MR signal with said MR signal receiving coil.

7. A method as claimed in claim 1 comprising determining said calibrated k-space trajectory according to:

$$\Delta \emptyset_{1,r}(t) = K_{1,r}(t)$$

$$\Delta \emptyset_{2,r}(t) = D_r K_{2,r}(t)$$

$$K_{2,r}^{cal}(t) = K_{2,r}(t) - K_{1,r}^{extend}(t)$$

wherein, r is the spatial encoding direction; $\Delta\emptyset_{1,r}(t)$ is the phase of the first magnetic resonance signal; $\Delta\emptyset_{2,r}(t)$ is a cumulative phase of the second magnetic resonance signal; $D_r$ is the distance from the slice to the gradient isocenter in the spatial encoding direction r; $K_{1,r}(t)$ is a k-space trajectory that results from the background field calculated from the first magnetic resonance signal; $K_{2,r}(t)$ is a k-space trajectory calculated from the second magnetic resonance signal; $K_{1,r}^{extend}(t)$ is the k-space trajectory resulting from the background field through a linear fit of the first magnetic resonance signal within blank window, and $K_{2,r}^{cal}(t)$ is the calibrated k-space trajectory in the spatial encoding direction r.

8. A magnetic resonance (MR) apparatus comprising:
an MR data acquisition scanner;
a computer configured to operate said MR data acquisition scanner to apply a radio-frequency (RF) excitation pulse and slice selection gradient pulse in said MR data acquisition scanner;
said computer being configured to operate said MR data acquisition scanner to set a blank window following said RF excitation pulse in any spatial encoding direction, with no gradient field being applied during said blank window;
said computer being configured to operate said MR data acquisition scanner to acquire a first MR signal during said blank window, resulting from said RF excitation pulse, in order to obtain a phase of said first MR resonance signal;
said computer being configured to operate said MR data acquisition scanner to apply a gradient field at a time outside said blank window, and to acquire a second MR signal during said blank window, resulting from said RF excitation and said gradient field, in order to obtain a phase of said second MR signal;
a processor provided with said first and second MR signals to a processor, said processor being configured to enter said first and second MR signals into a memory organized as k-space along a first k-space trajectory and a second k-space trajectory respectively based on said phase of said first MR signal and said phase of said second MR signal; and
said processor being configured to determine a calibrated k-space trajectory in a spatial encoding direction based on said first k-space trajectory and said second k-space trajectory.

9. An MR apparatus as claimed in claim 8 wherein said computer is configured to set said blank window by applying said RF excitation pulse and said slice selection gradient and excite a magnetic resonance signal in eccentric slices, while not applying any gradient field within said blank window, based on a preset width of said blank window after said excitation.

10. An MR apparatus as claimed in claim 9 comprising wherein said computer is configured to control said time when no gradient field is activated dependent on said preset width of said blank window.

11. An MR apparatus as claimed in claim 10 comprising wherein said computer is configured to set said width of said blank window according to at least one of an accuracy requirement or a speed requirement for filling said first and second k-space trajectories.

12. An MR apparatus as claimed in claim 8 wherein said computer is configured to operate said MR data acquisition scanner to acquire said first MR signal by activating an MR signal receiving coil of said MR data acquisition scanner, and to acquire said first MR signal produced by a basic magnetic field modulation under all gradients.

13. An MR apparatus as claimed in claim 8 wherein said computer is configured to operate said MR data acquisition scanner to acquire said second MR signal outside said blank window by, after activating an encoding gradient field, to activate an MR signal receiving coil of said MR data acquisition scanner, and to receive said second MR signal with said MR signal receiving coil.

14. An MR apparatus as claimed in claim 8 wherein said processor is configured to determine said calibrated k-space trajectory according to:

$$\Delta \emptyset_{1,r}(t) = K_{1,r}(t)$$

$$\Delta \emptyset_{2,r}(t) = D_r K_{2,r}(t)$$

$$K_{2,r}^{cal}(t) = K_{2,r}(t) - K_{1,r}^{extend}(t)$$

wherein, r is the spatial encoding direction; $\Delta\emptyset_{1,r}(t)$ is the phase of the first magnetic resonance signal; $\Delta\emptyset_{2,r}(t)$ is a cumulative phase of the second magnetic resonance signal; $D_r$ is the distance from the slice to the gradient isocenter in the spatial encoding direction r; $K_{1,r}(t)$ is a k-space trajectory that results from the background field calculated from the first magnetic resonance signal; $K_{2,r}(t)$ is a k-space trajectory calculated from the second magnetic resonance signal; $K_{1,r}^{extend}(t)$ is the k-space trajectory resulting from the background field through a linear fit of the first magnetic resonance signal within blank window, and $K_{2,r}^{cal}(t)$ is the calibrated k-space trajectory in the spatial encoding direction r.

15. A non-transitory, computer-readable data storage medium encoded with programming instructions, said storage medium being loaded into a computer of a magnetic resonance (MR) apparatus comprising an MR data acquisition scanner, said programming instructions causing said computer to:
operate said MR data acquisition scanner to apply a radio-frequency (RF) excitation pulse and slice selection gradient pulse in said MR data acquisition scanner;
operate said MR data acquisition scanner to set a blank window following said RF excitation pulse in any spatial encoding direction, with no gradient field being applied during said blank window;
operate said MR data acquisition scanner to acquire a first MR signal during said blank window, resulting from said RF excitation pulse, in order to obtain a phase of said first MR resonance signal;
operate said MR data acquisition scanner to apply a gradient field at a time outside said blank window, and to acquire a second MR signal during said blank window, resulting from said RF excitation and said gradient field, in order to obtain a phase of said second MR signal;
enter said first and second MR signals into a memory organized as k-space along a first k-space trajectory and a second k-space trajectory respectively based on said phase of said first MR signal and said phase of said second MR signal; and determine a calibrated k-space trajectory in a spatial encoding direction based on said first k-space trajectory and said second k-space trajectory.

\* \* \* \* \*